(12) United States Patent
Bae et al.

(10) Patent No.: US 9,443,978 B2
(45) Date of Patent: Sep. 13, 2016

(54) SEMICONDUCTOR DEVICE HAVING GATE-ALL-AROUND TRANSISTOR AND METHOD OF MANUFACTURING THE SAME

(71) Applicant: SAMSUNG ELECTRONICS CO., LTD., Suwon-si, Gyeonggi-do (KR)

(72) Inventors: Dong-Il Bae, Incheon (KR); Kang-Ill Seo, Chungcheongbuk-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 35 days.

(21) Appl. No.: 14/330,305

(22) Filed: Jul. 14, 2014

(65) Prior Publication Data

US 2016/0013309 A1    Jan. 14, 2016

(51) Int. Cl.
| H01L 23/52 | (2006.01) |
| H01L 29/78 | (2006.01) |
| H01L 27/088 | (2006.01) |
| H01L 27/092 | (2006.01) |
| H01L 29/66 | (2006.01) |
| H01L 27/11 | (2006.01) |

(52) U.S. Cl.
CPC ......... *H01L 29/785* (2013.01); *H01L 27/0886* (2013.01); *H01L 27/0924* (2013.01); *H01L 27/1104* (2013.01); *H01L 29/66795* (2013.01); *H01L 2029/7858* (2013.01)

(58) Field of Classification Search
CPC ............... H01L 29/785; H01L 27/11; H01L 29/66795; H01L 27/0924; H01L 27/0886; H01L 2029/7858
See application file for complete search history.

(56) References Cited

U.S. PATENT DOCUMENTS

| 7,514,325 | B2 | 4/2009 | Kim et al. |
| 7,652,308 | B2 | 1/2010 | Park et al. |
| 7,923,337 | B2 | 4/2011 | Chang et al. |
| 8,101,473 | B2 | 1/2012 | Cho et al. |
| 9,023,705 | B1 * | 5/2015 | Paul ................ H01L 21/823431 438/283 |
| 2009/0078982 | A1 | 3/2009 | Rachmady et al. |
| 2011/0147840 | A1 | 6/2011 | Cea et al. |
| 2012/0138886 | A1 | 6/2012 | Kuhn et al. |
| 2014/0225065 | A1 * | 8/2014 | Rachmady ........ H01L 29/42392 257/24 |

FOREIGN PATENT DOCUMENTS

| KR | 1020070117143 | 12/2007 |
| KR | 1020080092603 | 10/2008 |

* cited by examiner

*Primary Examiner* — Victor A Mandala
(74) *Attorney, Agent, or Firm* — F. Chau & Associates, LLC.

(57) ABSTRACT

A semiconductor device includes a fin structure disposed on a substrate, a sacrificial layer pattern disposed on the fin structure, an active layer pattern disposed on the sacrificial layer pattern, and a gate dielectric layer and a gate electrode layer extending through the sacrificial layer pattern and surrounding a portion of the active layer pattern.

20 Claims, 26 Drawing Sheets

6

1200

1300

1400

SEMICONDUCTOR DEVICE HAVING GATE-ALL-AROUND TRANSISTOR AND METHOD OF MANUFACTURING THE SAME

TECHNICAL FIELD

Exemplary embodiments of the present inventive concept relate to a semiconductor device having a gate-all-around transistor, and to a method of manufacturing a semiconductor device having a gate-all-around transistor.

DISCUSSION OF THE RELATED ART

Recently, semiconductor devices capable of high speed operation and high integration have been developed. However, characteristics such as, for example, a short channel effect, a narrow width effect, channel length modulation, etc., may have a negative impact on the performance of these highly integrated semiconductor devices.

SUMMARY

Exemplary embodiments of the present inventive concept provide a semiconductor device having a gate-all-around transistor, and a method of manufacturing a semiconductor device having a gate-all-around transistor.

In an exemplary embodiment, the semiconductor device includes a fin structure disposed on a substrate, a sacrificial layer pattern disposed on the fin structure, an active layer pattern disposed on the sacrificial layer pattern, and a gate dielectric layer and a gate electrode layer extending through the sacrificial layer pattern and surrounding a portion of the active layer pattern.

In an exemplary embodiment, the semiconductor device further includes a spacer disposed on a sidewall of the gate electrode layer, and a source/drain structure disposed on the active layer pattern. The source/drain structure is separated from the gate electrode layer by the spacer, and the sacrificial layer pattern is disposed under the source/drain structure and is not disposed under the gate electrode layer.

In an exemplary embodiment, the source/drain structure covers an upper surface and a sidewall of the active layer pattern.

In an exemplary embodiment, the sacrificial layer pattern includes a semiconductor material.

In an exemplary embodiment, the semiconductor material includes silicon germanium (SiGe).

In an exemplary embodiment, the sacrificial layer pattern includes an insulating material.

In an exemplary embodiment, the insulating layer includes silicon oxide.

In an exemplary embodiment, the gate electrode layer includes a metal material.

In an exemplary embodiment, the substrate includes a first region and a second region, the fin structure includes a first fin structure disposed in the first region and a second fin structure disposed in the second region, the sacrificial layer pattern includes a first sacrificial layer pattern disposed on the first fin structure and a second sacrificial layer pattern disposed on the second fin structure, the active layer pattern includes a first active layer pattern disposed on the first sacrificial layer pattern and a second active layer pattern disposed on the second sacrificial layer pattern, the gate dielectric layer includes a first gate dielectric layer and a second gate dielectric layer, the gate electrode layer includes a first gate electrode layer and a second gate electrode layer, the first gate dielectric layer and the first gate electrode layer extend through the first sacrificial layer pattern and surround a portion of the first active layer pattern, and the second gate dielectric layer and the second gate electrode layer extend through the second sacrificial layer pattern and surround a portion of the second active layer pattern.

In an exemplary embodiment, the first sacrificial layer pattern includes a different material from the second sacrificial layer pattern.

In an exemplary embodiment, the first sacrificial layer pattern includes a semiconductor material and the second sacrificial layer pattern includes an insulating material.

In an exemplary embodiment, the semiconductor material includes silicon germanium (SiGe) and the insulating material includes silicon oxide.

In an exemplary embodiment, the semiconductor device includes a first gate-all-around transistor having the first fin structure, the first active layer pattern, the first gate dielectric layer, and the first gate electrode layer, and a second gate-all-around transistor having the second fin structure, the second active layer pattern, the second gate dielectric layer, and the second gate electrode layer. The first gate-all-around transistor may include a PMOS transistor, and the second gate-all-around transistor may include an NMOS transistor.

In an exemplary embodiment, the first sacrificial layer pattern has a first germanium concentration and the second sacrificial layer pattern has a second germanium concentration. The first germanium concentration may be less than the second germanium concentration.

In an exemplary embodiment, a semiconductor device includes a substrate including a first region and a second region, a first gate-all-around transistor disposed in the first region, the first gate-all-around transistor including a first fin structure, a first sacrificial layer pattern disposed on the first fin structure, a first active layer pattern disposed on the first sacrificial layer pattern, and a first gate electrode layer extending through the first sacrificial layer pattern and surrounding a portion of the first active layer pattern, and a second gate-all-around transistor disposed in the second region, the second gate-all-around transistor including a second fin structure, a second sacrificial layer pattern disposed on the second fin structure, a second active layer pattern disposed on the second sacrificial layer pattern, and a second gate electrode layer extending through the second sacrificial layer pattern and surrounding a first portion of the second active layer pattern. The first gate electrode layer may completely surround the portion of the first active layer pattern, and the second gate electrode layer may partially surround the first portion of the second active layer pattern.

In an exemplary embodiment, the semiconductor device includes an insulating layer disposed under a second portion of the second active layer pattern, and the second portion of the second active layer pattern is not overlapped by the second gate electrode layer.

In an exemplary embodiment, the insulating layer includes a silicon oxide layer.

In an exemplary embodiment, the first and second sacrificial layer patterns include a semiconductor material.

In an exemplary embodiment, the semiconductor material includes silicon germanium (SiGe).

In an exemplary embodiment, the first region corresponds to a logic region and the second region corresponds to an SRAM region.

In an exemplary embodiment, a method of manufacturing a semiconductor device includes forming a fin structure on a substrate, forming a sacrificial layer pattern on the fin structure, the sacrificial layer pattern including a first region and a second region, forming an active layer pattern on the sacrificial layer pattern, the active layer pattern including a first region formed on the first region of the sacrificial layer pattern and a second region formed on the second region of the sacrificial layer pattern, forming a dummy gate pattern crossing the first region of the active layer pattern, forming an interlayer dielectric layer on the dummy gate pattern and the second potion of the active layer pattern, planarizing the interlayer dielectric layer to expose the dummy gate pattern, removing the dummy gate pattern to expose the first region of the active layer pattern and the first region of the sacrificial layer pattern, removing the first region of the sacrificial layer pattern, forming a gate dielectric layer on the first region of the active layer pattern, the gate dielectric layer surrounding the first region of the active layer pattern, and forming a gate electrode layer on the gate dielectric layer, the gate electrode layer surrounding the first region of the active layer pattern.

In an exemplary embodiment, the sacrificial layer pattern and the active layer pattern are formed using an epitaxial growth process.

In an exemplary embodiment, the method further includes forming a source/drain structure on the second region of the active layer pattern using an epitaxial growth process.

In an exemplary embodiment, the method of removing the first region of the sacrificial layer pattern may be performed using a selective etching process.

In an exemplary embodiment, the selective etching process includes a wet etching process.

BRIEF DESCRIPTION OF THE DRAWINGS

The above and other features of the present inventive concept will become more apparent by describing in detail exemplary embodiments thereof with reference to the accompanying drawings in which.

DETAILED DESCRIPTION OF THE EXEMPLARY EMBODIMENTS

Figure 1:
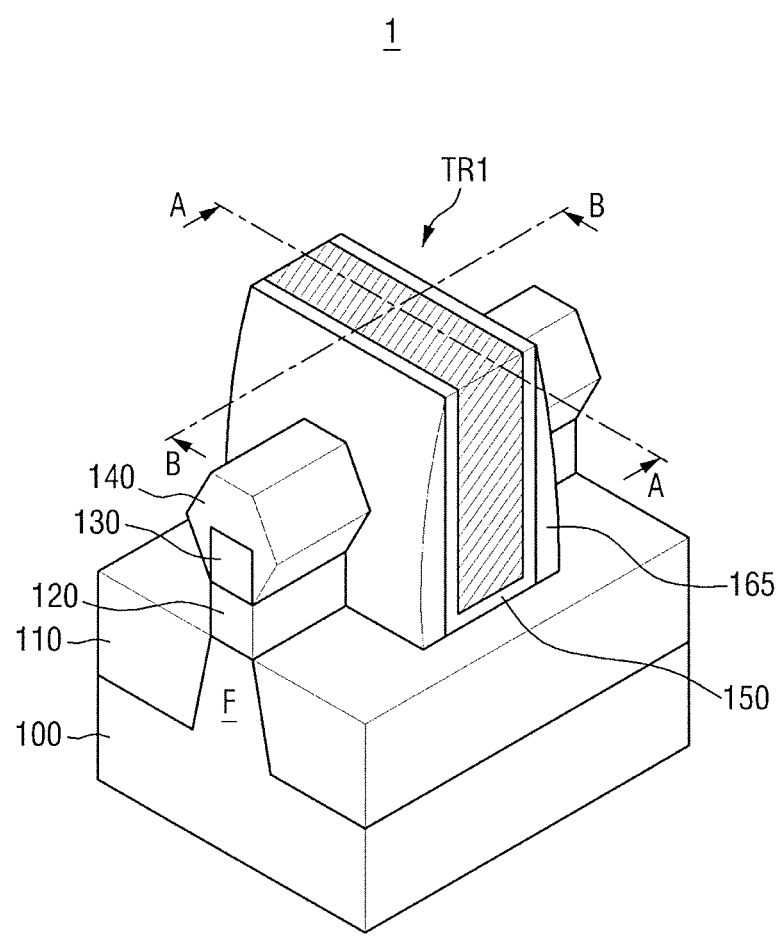
FIG. 1 is a perspective view illustrating a semiconductor device according to an exemplary embodiment of the present inventive concept.

Exemplary embodiments of the present inventive concept will be more fully described hereinafter with reference to the accompanying drawings. Like reference numerals may refer to like elements throughout the accompanying drawings.

It will be understood that when an element is referred to as being "on," "connected" or "coupled" to another element, it can be directly on, connected or coupled to the other element or intervening elements may be present.

It will be understood that, although the terms "first", "second", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under the layer, or one or more intervening layers may also be present. In addition, it will also be understood that when a layer is referred to as being "between" two layers, it can be the only layer between the two layers, or one or more intervening layers may also be present.

Spatially relative terms, e.g., "beneath," "below," "lower," "above," "upper," etc., may be used herein for ease of description to describe the relationship of one element or feature to another element(s) or feature(s), as illustrated in the figures. It will be understood that the spatially relative terms are intended to encompass different orientations of the device in use. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

Figure 2:
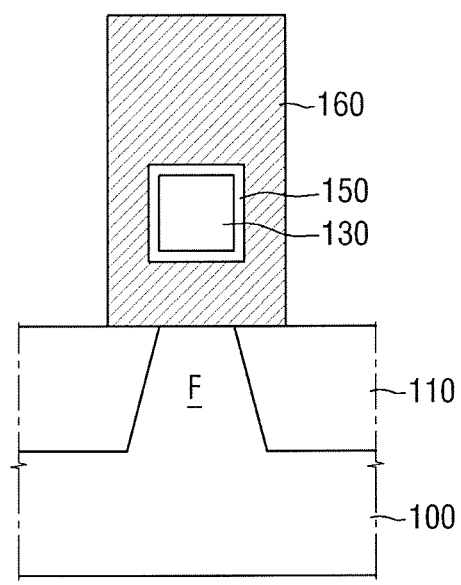
FIG. 2 is a cross-sectional view corresponding to line A-A of FIG. 1.
Figure 3:
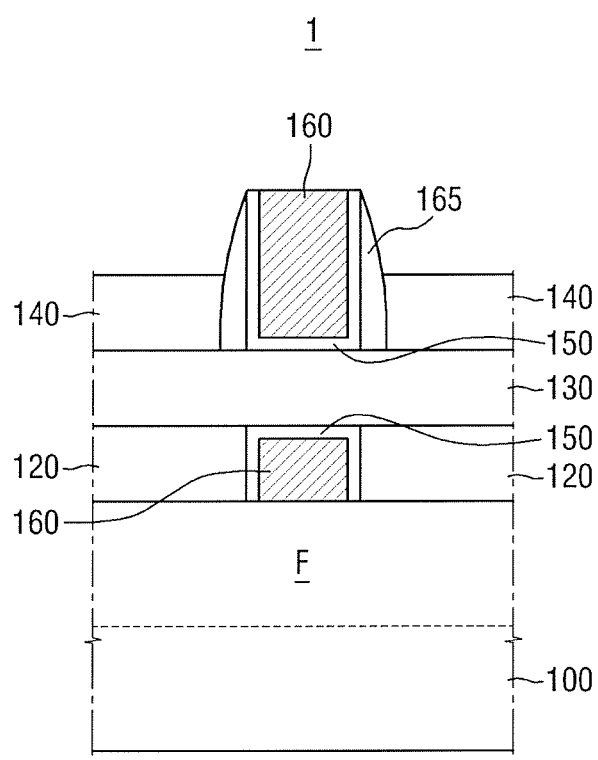
FIG. 3 is a cross-sectional view corresponding to line B-B of FIG. 1.

FIG. 1 is a perspective view illustrating a semiconductor device according to an exemplary embodiment of the present inventive concept. FIGS. 2 and 3 are cross-sectional views corresponding to lines A-A and B-B of FIG. 1, respectively.

Referring to FIGS. 1 through 3, a semiconductor device 1 may include a first gate-all-around transistor TR1. The first gate-all-around transistor TR1 may include a substrate 100, a fin structure F, a sacrificial layer pattern 120, an active layer pattern 130, a source/drain structure 140, a gate dielectric layer 150, and a gate electrode layer 160. The first gate-all-around transistor TR1 may be, for example, a field effect transistor (FET).

The substrate 100 may include, for example, a bulk silicon substrate or a silicon-on-insulator (SOI) substrate. The substrate 100 may be formed of, for example, silicon (Si), germanium (Ge), silicon germanium (SiGe), indium antimonide (InSb), lead telluride (PbTe), indium arsenide (InAs), indium phosphide (InP), gallium arsenide (GaAs), and/or gallium antimonide (GaSb).

The substrate 100 may also include an epitaxial layer. The epitaxial layer may include, for example, silicon (Si) or germanium (Ge). The epitaxial layer may also include a compound semiconductor such as, for example, a 4-4 group compound semiconductor or a 3-5 group compound semiconductor. The 4-4 group compound semiconductor may be a binary compound or a ternary compound having at least two materials of carbon (C), silicon (Si), germanium (Ge), and stannum (Sn), however the 4-4 group compound semiconductor is not limited thereto. The 3-5 group compound semiconductor may be a binary compound, a ternary compound, or a quaternary compound having at least two materials of aluminum (Al), gallium (Ga), indium (In), phosphorus (P), arsenic (As), and antimony (Sb), however the 3-5 group compound semiconductor is not limited thereto.

The fin structure F may be formed on the substrate 100. According to exemplary embodiments, the fin structure F may be formed of the same material as the substrate 100, or the fin structure F may be formed of a different material from the substrate 100.

The fin structure F may have a shape protruding from the substrate 100. According to exemplary embodiments, the fin structure F may have a tapered shape having a larger bottom width, or a rectangular shape having substantially the same width at the top and the bottom. In an exemplary embodiment, the top edge of the fin structure F may have a rounded shape.

A device isolation structure 110 may be formed on the substrate 100 and may cover a sidewall of the fin structure F. The device isolation structure 110 may be formed of an insulating layer such as, for example, a silicon oxide layer, a silicon nitride layer, or a silicon oxynitride layer.

A sacrificial layer pattern 120 may be formed on the fin structure F. The sacrificial layer pattern 120 may include a semiconductor material such as, for example, silicon germanium (SiGe). In an exemplary embodiment in which the sacrificial layer pattern 120 includes silicon germanium (SiGe), the proportion of germanium (Ge) may be higher than that of silicon (Si). As a result, etching selectivity between the sacrificial layer pattern 120 and the other layers which have a lower proportion of germanium (Ge) may be increased.

An active layer pattern 130, having a first portion and a second portion, may be formed on the sacrificial layer pattern 120. The active layer pattern 130 may include, for example, a silicon layer or a 3-5 group compound semiconductor which may be formed using an epitaxial growth process. The active layer pattern 130 may be formed of substantially the same material as the fin structure F. The first portion of the active layer pattern 130 may be used as a channel region of the first gate-all-around transistor TR1.

The gate dielectric layer 150 may be formed on the active layer pattern 130. The gate dielectric layer 150 may extend through the sacrificial layer pattern 120 and may surround the first portion of the active layer pattern 130. In an exemplary embodiment, the gate dielectric layer 150 completely surrounds the first portion of the active layer pattern 130, as shown in FIG. 2. A portion of the gate dielectric layer 150 may extend upwardly along a sidewall of a spacer 165, as shown in FIG. 1. The spacer 165 may include, for example, a silicon oxide layer, a silicon nitride layer, or a silicon oxynitride layer.

The gate dielectric layer 150 may include a high-k dielectric layer such as, for example, a hafnium oxide layer, an aluminum oxide layer, a zirconium oxide layer, or a tantalum oxide layer.

In an exemplary embodiment, an interfacial layer may be formed between the gate dielectric layer 150 and the active layer pattern 130. The interfacial layer may be formed of, for example, a low-k dielectric layer having a dielectric constant less than about 9. For example, the interfacial layer may be formed of a silicon oxide layer, a silicon oxynitride layer, or a mixture thereof.

A gate electrode layer 160 may be formed on the gate dielectric layer 150 and may cross over the first portion of the active layer pattern 130. The gate electrode layer 160 may also extend through the sacrificial layer pattern 120 and may surround the first portion of the active layer pattern 130. In an exemplary embodiment, the gate electrode layer 160 completely surrounds the first portion of the active layer pattern 130, as shown in FIG. 2. The gate electrode layer 160 may include a metal such as, for example, tungsten (W), aluminum (Al), or a mixture thereof. In an exemplary embodiment, the gate electrode layer 160 may further include a work function metal layer to control the work function of the first gate-all-around transistor TR1. The work function metal layer may include, for example, titanium (Ti), tantalum (Ta), titanium nitride (TiN), or a mixture thereof.

The source/drain structure 140 may be formed on the second portion of the active layer pattern 130 and at both sides of the gate electrode layer 160. The source/drain structure 140 corresponds to a source or a drain of the semiconductor device 1. The source/drain structure 140 may be isolated or separated from the gate electrode layer 160 by the spacer 165 and the gate dielectric layer 150. The spacer 165 may have, for example, a rounded shape, an I-shape, or an L-shape. The source/drain structure 140 may be formed using a selective epitaxial growth process. The source/drain structure 140 may cover a portion of sidewall of the active layer pattern 130 and may not be formed under the active layer pattern 130. Therefore, the lowermost surface of the source/drain structure 140 may have a level higher than or equal to the uppermost surface of the sacrificial layer pattern 120, however, the source/drain structure 140 is not limited thereto. In an exemplary embodiment, the source/drain structure 140 may be formed without an epitaxial layer in the active layer pattern 130 by injecting impurities therein using an ion implantation process. For example, when the first gate-all-around transistor TR1 is a PMOS transistor, the source/drain structure 140 may include p-type impurities.

An interlayer dielectric layer 154 (shown in FIG. 21) may be formed on the device isolation structure 110. The interlayer dielectric layer 154 may cover the sacrificial layer pattern 120 and the source/drain structure 140.

According to an exemplary embodiment of the present inventive concept, the gate electrode layer 160 may be formed both on the active layer pattern 130 and also under the active layer pattern 130. Therefore, the operating current value of the first gate-all-around transistor TR1 may be increased and the leakage current value of the first gate-allaround transistor TR1 may be decreased. As a result, the reliability and the performance of the semiconductor device may be improved.

Figure 4:
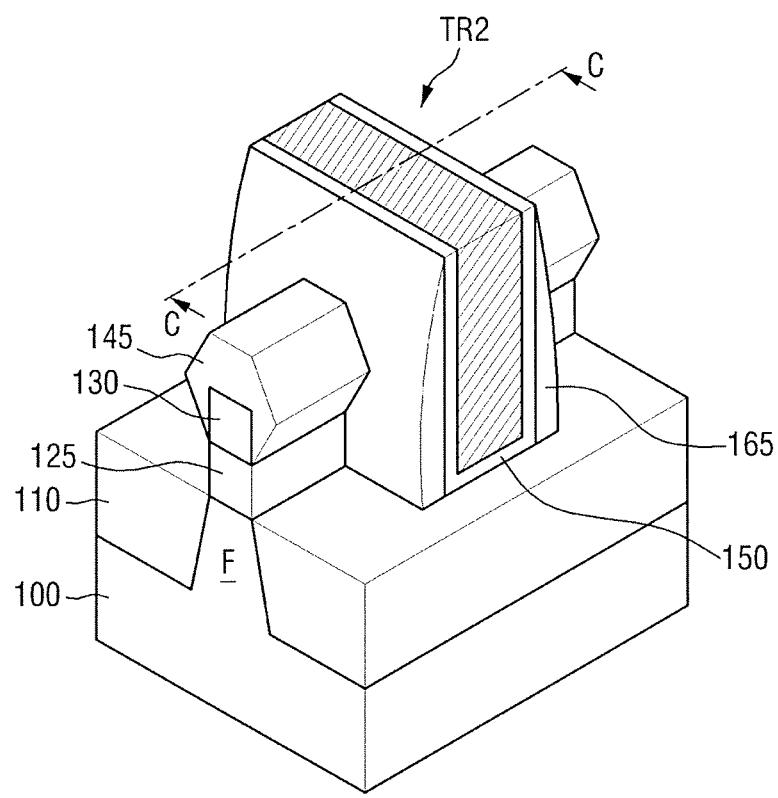
FIG. 4 is a perspective view illustrating a semiconductor device according to an exemplary embodiment of the present inventive concept.
Figure 5:
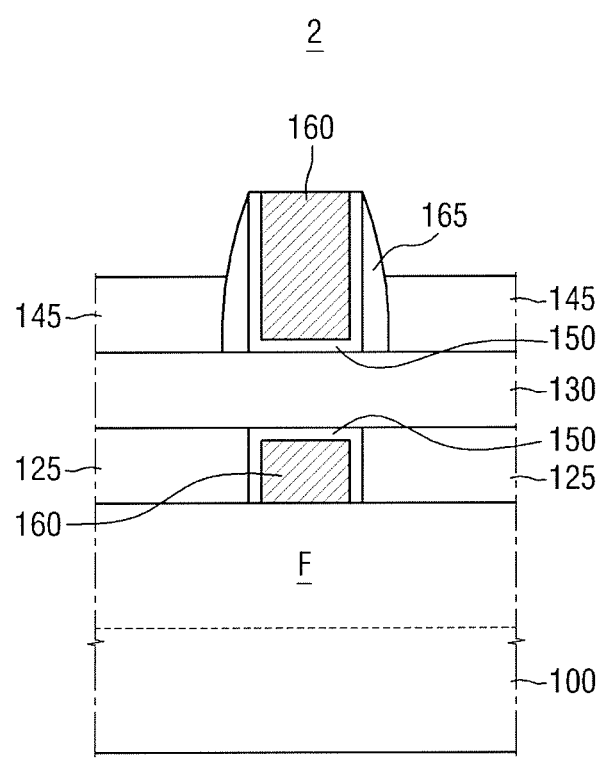
FIG. 5 is a cross-sectional view corresponding to line C-C of FIG. 4.

FIG. 4 is a perspective view illustrating a semiconductor device according to an exemplary embodiment of the present inventive concept. FIG. 5 is a cross-sectional view corresponding to line C-C of FIG. 4.

Referring to FIGS. 4 and 5, a semiconductor device 2 including a second gate-all-around transistor TR2 may include a sacrificial layer pattern 125 formed of a different material from the sacrificial layer pattern 120 of the first gate-all-around transistor TR1. For example, the sacrificial layer pattern 125 may be formed of a silicon oxide layer. In an exemplary embodiment in which the second gate-all-around transistor TR2 is an NMOS transistor, the second gate-all-around transistor TR2 may include a source/drain structure 145 having n-type impurities.

Processes of forming the fin structure F, the active layer pattern 130, the gate dielectric layer 150, the gate electrode layer 160, etc., may be similar to the processes described above. For convenience of explanation, a description of processes previously described may be omitted.

Figure 6:
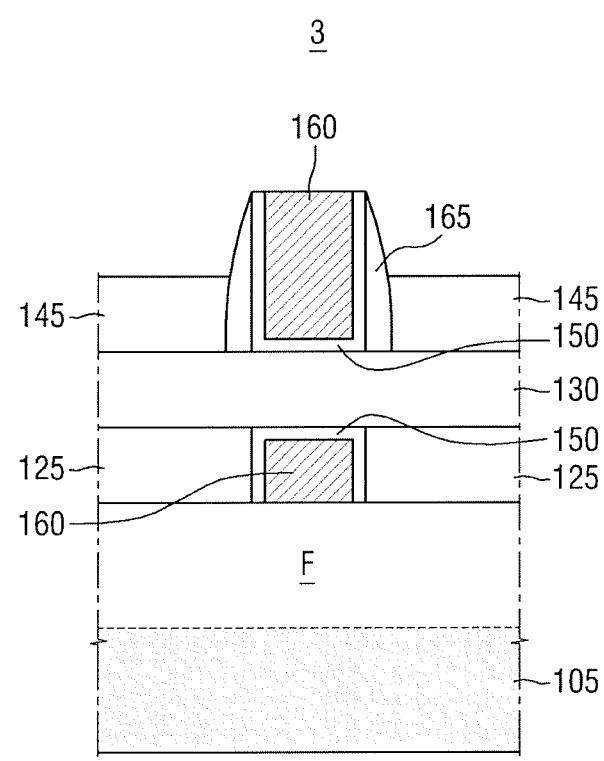
FIG. 6 is a cross-sectional view illustrating a semiconductor device according to an exemplary embodiment of the present inventive concept.

FIG. 6 is a cross-sectional view illustrating a semiconductor device according to an exemplary embodiment of the present inventive concept. For convenience of explanation, a description of elements previously described may be omitted.

Referring to FIG. 6, a fin structure F of a semiconductor device 3 may be formed on an insulator 105. For example, the semiconductor device 3 may be formed on a silicon-on-insulator (SOI) substrate. In this case, the fin structure F may be formed by growing an epitaxial layer and patterning the epitaxial layer.

Figure 7:
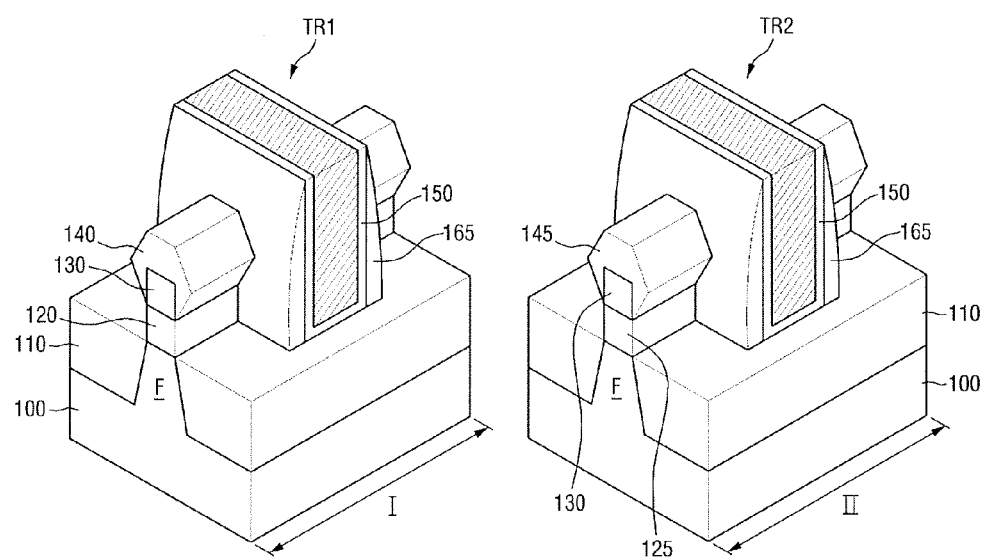
FIG. 7 is a perspective view illustrating a semiconductor device according to an exemplary embodiment of the present inventive concept.

FIG. 7 is a perspective view illustrating a semiconductor device according to an exemplary embodiment of the present inventive concept.

Referring to FIG. 7, a semiconductor device 4 may include a first gate-all-around transistor TR1 having a p-type source/drain structure 140 and a second gate-all-around transistor TR2 having an n-type source/drain structure 145. The semiconductor device 4 may be formed on a substrate 100 having a first region I and a second region II. The first gate-all-around transistor TR1 may be formed in the first region I and the second gate-all-around transistor TR2 may be formed in the second region II.

A first sacrificial layer pattern 120 may be formed in the first region I and a second sacrificial layer pattern 125 may be formed in the second region II. The first sacrificial layer pattern 120 and the second sacrificial layer pattern 125 may be formed of different materials from each other. For example, the first sacrificial layer pattern 120 may include a semiconductor layer and the second sacrificial layer pattern 125 may include an insulating layer. In an exemplary embodiment, the first sacrificial layer pattern 120 may include a silicon germanium (SiGe) layer and the second sacrificial layer pattern 125 may include a silicon oxide layer.

In an exemplary embodiment in which the first sacrificial layer pattern 120 includes a silicon germanium layer, a compressive stress may be induced in the channel region of the first gate-all-around transistor TR1. As a result, the p-type carrier mobility may be increased in the channel region formed in a portion of the first sacrificial layer pattern 120. In an exemplary embodiment in which the second sacrificial layer pattern 125 includes a silicon oxide layer, any potential compressive stress may not be induced in the channel region of the second gate-all-around transistor TR2.

As a result, n-type carrier mobility may not be decreased in the channel region formed in a portion of the second sacrificial layer pattern 125.

In an exemplary embodiment, both the first sacrificial layer pattern 120 and the second sacrificial layer pattern 125 may include a silicon germanium layer. The first sacrificial layer pattern 120 may have a first germanium concentration and the second sacrificial layer pattern 125 may have a second germanium concentration. The first and second germanium concentrations may be different from each other. For example, the first germanium concentration may be greater than the second germanium concentration.

In an exemplary embodiment, the first gate-all-around transistor TR1 is a PMOS transistor, and the second gate-all-around transistor is an NMOS transistor.

Figure 8:
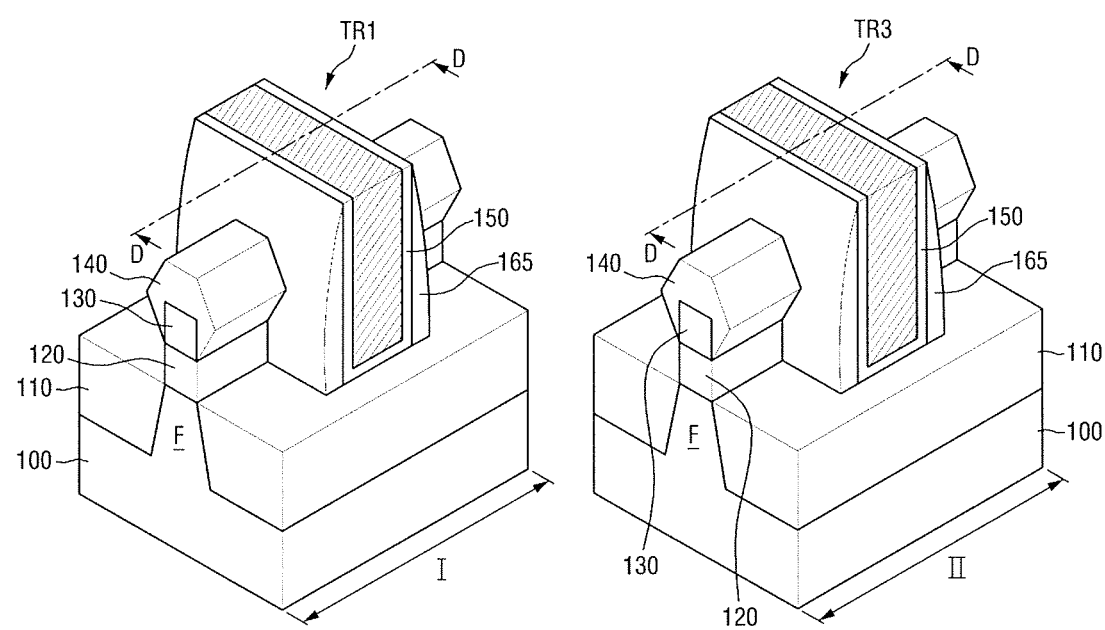
FIG. 8 is a perspective view illustrating a semiconductor device according to an exemplary embodiment of the present inventive concept.
Figure 9:
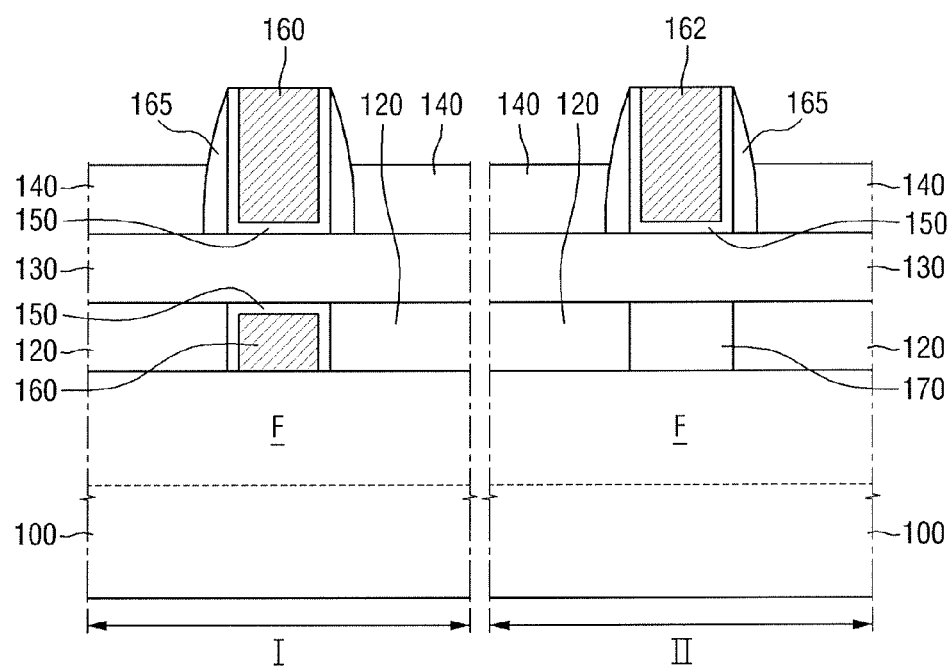
FIG. 9 is a cross-sectional view corresponding to line D-D of FIG. 8.

FIG. 8 is a perspective view illustrating a semiconductor device according to an exemplary embodiment of the present inventive concept. FIG. 9 is a cross-sectional view corresponding to line D-D of FIG. 8.

Referring to FIGS. 8 and 9, a semiconductor device 5 may include a first gate-all-around transistor TR1 and a third gate-all-around transistor TR3, which are formed on a substrate 100 and have a channel region, respectively. The substrate 100 may have a first region I and a second region II. The first gate-all-around transistor TR1 may be formed in the first region I and the third gate-all-around transistor TR3 may be formed in the second region II.

A first gate electrode layer 160 of the first gate-all-around transistor TR1 may surround a portion of the channel region formed in the first region I. In an exemplary embodiment, the first gate electrode layer 160 may completely surround a portion of the channel region formed in the first region I. For example, the first gate electrode layer 160 may surround the top, sidewall, and bottom of the active layer pattern 130 in the first region I.

A second gate electrode layer 162 of the third gate-all-around transistor TR3 may partially surround a portion of the channel region formed in the second region II. For example, the second gate electrode layer 162 may surround only the top and sidewall of the active layer pattern 130 in the second region II.

A sacrificial layer pattern 120 and an insulating layer 170 may be formed under the active layer pattern 130 in the second region II. For example, the sacrificial layer pattern 120, which may include a silicon germanium layer, may be formed under a portion of the active layer pattern 130 in an area in which a source/drain structure 140 is formed thereon, and the insulating layer 170 may be formed under another portion of the active layer pattern 130 in an area in which the gate dielectric layer 150 and the second gate electrode layer 162 are formed thereon.

In an exemplary embodiment, both the first gate-all-around transistor TR1 and the third gate-all-around transistor TR3 may be the same type transistors. For example, both the first gate-all-around transistor TR1 and the third gate-all-around transistor TR3 may be n-type transistors or p-type transistors. Alternatively, the first gate-all-around transistor TR1 may be a p-type transistor and the third gate-all-around transistor TR3 may be an n-type transistor.

Figure 10:
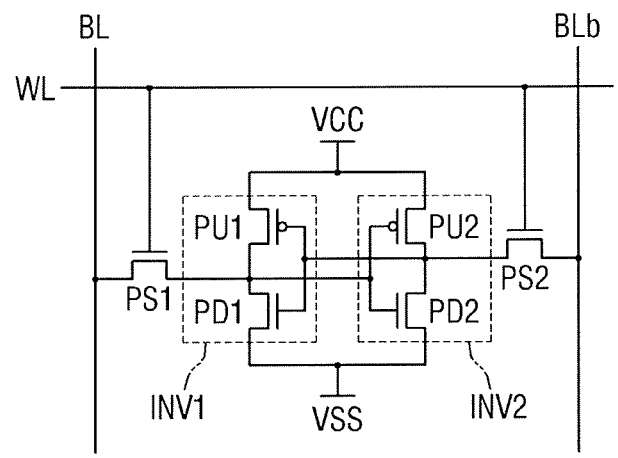
FIG. 10 is a circuit diagram illustrating a semiconductor device according to an exemplary embodiment of the present inventive concept.
Figure 11:
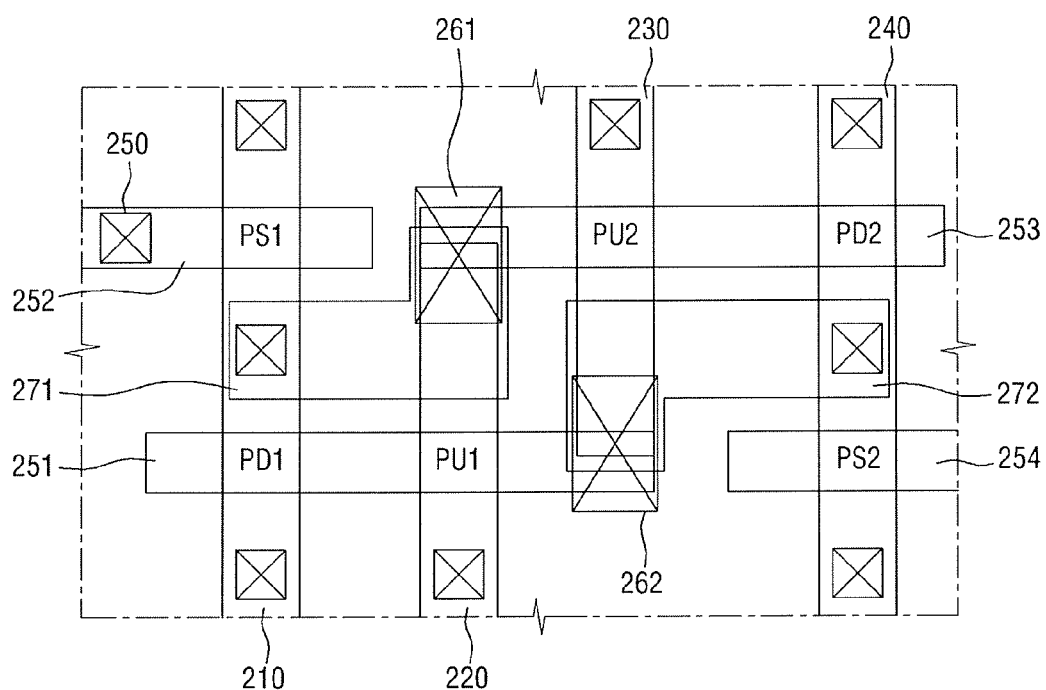
FIG. 11 is an equivalent layout of the circuit diagram shown in FIG. 10.

FIG. 10 is a circuit diagram illustrating a semiconductor device according to an exemplary embodiment of the present inventive concept. FIG. 11 is an equivalent layout of the circuit diagram shown in FIG. 10.

Referring to FIG. 10, a semiconductor device 6 may include an SRAM (Static Random Access Memory) device having a first inverter INV1 and a second inverter INV2, which are formed between a power supply node VCC and a ground node VSS. The first inverter INV1, having an input node and an output node, may have a first pull-up transistor PU1 and a first pull-down transistor PD1. The second inverter INV2, having an input node and an output node, may have a second pull-up transistor PU2 and a second pull-down transistor PD2. The input node of the first inverter INV1 may be connected to a source/drain region of a first pass transistor PS1 as well as to the output node of the second inverter INV2. The input node of the second inverter INV2 may be connected to a source/drain region of a second pass transistor PS2 as well as to the output node of the first inverter INV1. Gate electrodes of the first and second pass transistors PS1 and PS2 may be connected to a word line WL. A bit line BL may be connected to a source/drain region of the first pass transistor PS1. A bit line bar BLb may be connected to a source/drain region of the second pass transistor PS2. The semiconductor device 6 may include at least one gate-all-around transistor according to the exemplary embodiments of the present inventive concept described herein.

Referring to FIG. 11, first through fourth active regions 210, 220, 230, and 240 may extend in a first direction. In an exemplary embodiment, the length of the second and third active regions 220 and 230 may be less than the length of the first and fourth active regions 210 and 240.

A first gate electrode 251 may cross over the first and second active regions 210 and 220 to form the first pull-down transistor PD1 and the first pull-up transistor PU1. A second gate electrode 252 may cross over the first active region 210 to form the first pass transistor PS1. The first gate electrode 251 and the second gate electrode 252 may be substantially parallel to and apart from each other. A third gate electrode 253 may cross over the third and fourth active regions 230 and 240 to form the second pull-down transistor PD2 and the second pull-up transistor PU2. A fourth gate electrode 254 may cross over the fourth active region 240 to form the second pass transistor PS2. The third gate electrode 253 and the fourth gate electrode 254 may be substantially parallel to and apart from each other.

A contact hole 250 may be formed on the gate electrode of the first and second pass transistors PS1 and PS2. Other contact holes may additionally be formed on the source/drain regions of the transistors described above.

A first shared contact 261 may be formed on a portion of the second active region 220. The first shared contact 261 may connect the source/drain of the first pull-up transistor PU1 to the gate electrodes of the second pull-up transistor PU2 and the second pull-down transistor PD2. A first interconnection line 271 may connect the first shared contact 261 to the source/drain regions of the first pull-up transistor PD1 and the first pass transistor PS1.

A second shared contact 262 may be formed on a portion of the third active region 230. The second shared contact 262 may connect the source/drain of the second pull-up transistor PU2 to the gate electrodes of the first pull-up transistor PU1 and the first pull-down transistor PD1. A second interconnection line 272 may connect the second shared contact 262 to the source/drain regions of the second pull-down transistor PD2 and the second pass transistor PS2.

Figure 12:
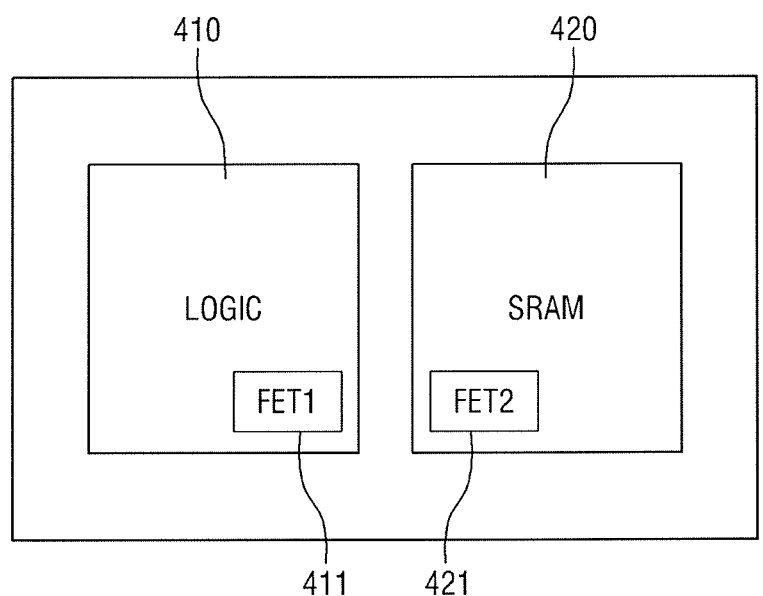
FIGS. 12 and 13 are block diagrams illustrating a semiconductor device according to exemplary embodiments of the present inventive concept.
Figure 13:
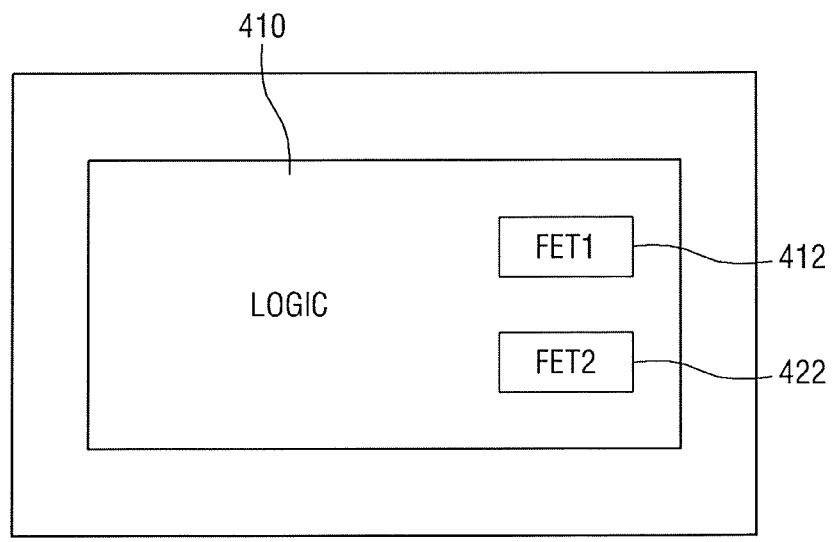

FIGS. 12 and 13 are block diagrams illustrating a semiconductor device according to exemplary embodiments of the present inventive concept.

Referring to FIG. 12, a semiconductor device 13 may include a logic region 410 and an SRAM region 420. A first transistor 411 may be disposed in the logic region 410 and a second transistor 421 may be disposed in the SRAM region 420. The types of the first transistor 411 and the second transistor 421 may be different from each other. For example, in an exemplary embodiment, the first transistor 411 may be the first gate-all-around transistor TR1 (shown in FIG. 7), and the second transistor 421 may be the second gate-all-around transistor TR2 (shown in FIG. 7). Alternatively, the types of the first transistor 411 and the second transistor 421 may be the same. In an exemplary embodiment, the first transistor 411 may be the first gate-all-around transistor TR1 (shown in FIG. 8), and the second transistor 421 may be the third gate-all-around transistor TR3 (shown in FIG. 8).

In exemplary embodiments, the SRAM region may be replaced with a DRAM region, an MRAM region, an RRAM region, or a PRAM region, or at least one of the DRAM region, the MRAM region, the RRAM region, and the PRAM region may be added with the SRAM region and the logic region 410.

Referring to FIG. 13, a semiconductor device 14 may include a logic region 410, a third transistor 412, and a fourth transistor 422. In an exemplary embodiment, the types of the third transistor 412 and the fourth transistor 422 may be different from each other. For example, the third transistor 412 may be the first gate-all-around transistor TR1 (shown in FIG. 7), and the fourth transistor 422 may be the second gate-all-around transistor TR2 (shown in FIG. 7). Alternatively, the types of the third transistor 412 and the fourth transistor 422 may be the same. In an exemplary embodiment, the first transistor 411 may be the first gate-all-around transistor TR1 (shown in FIG. 8), and the fourth transistor 422 may be the third gate-all-around transistor TR3 (shown in FIG. 8).

Figure 14:
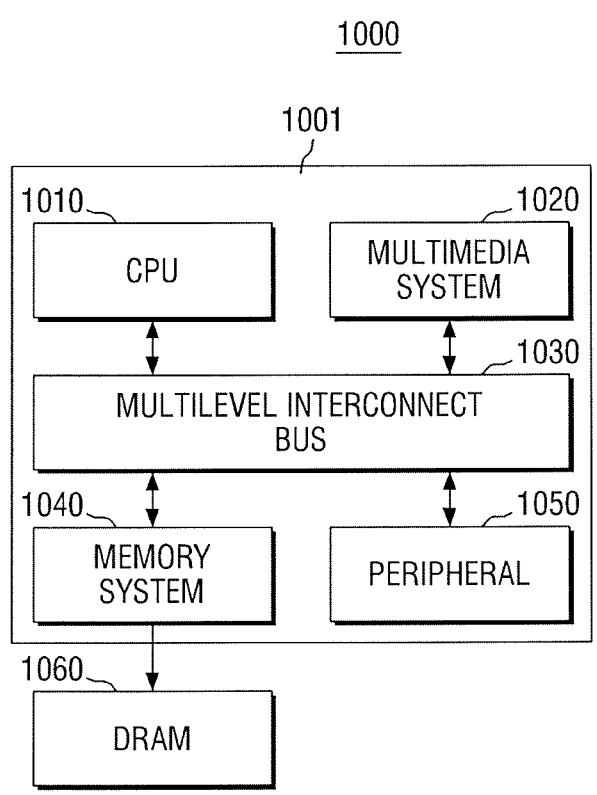
FIG. 14 is a system block diagram of an SoC (system-on-chip) including a semiconductor device according to an exemplary embodiment of the present inventive concept.

FIG. 14 is a system block diagram of an SoC (system-on-chip) including a semiconductor device according to an exemplary embodiment of the present inventive concept.

Referring to FIG. 14, the SoC may include an application processor 1001 and a DRAM device 1060. The application processor 1001 may include a central processing unit 1010, a multimedia system 1020, a bus (e.g., a multilevel interconnect bus) 1030, a memory system 1040, and a peripheral circuit 1050.

The central processing unit 1010 may perform operations for driving the SoC 1000. The multimedia system 1020 may include, for example, a three-dimensional (3D) engine module, a video codec, a display system, a camera system, and/or a post-processor. The central processing unit 1010, the multimedia system 1020, the memory system 1040, and the peripheral circuit 1050 may communicate with each other through the bus 1030. The bus 1030 may have a multi-layer structure. For example, the bus 1030 may be a multi-layer advanced high-performance bus (AHB) or a multi-layer advanced extensible interface (AXI).

The memory system 1040 may provide an environment for performing a high-speed operation while the application processor 1001 is connected to an external device. The external device may be, for example, a DRAM device. The peripheral circuit 1050 may provide an environment for which the SoC 1000 is able to smoothly connect to an external device. In this case, the external device may be, for example, a main board. The DRAM device 1060 may be disposed external to the application processor 1001, as shown in FIG. 14. In an exemplary embodiment, the DRAM device 1060 may be packaged with the application processor 1001 to form a PoP (package-on-package) structure.

At least one element of the SoC 1000 may include a semiconductor device according to exemplary embodiments of the present inventive concept described herein.

Figure 15:
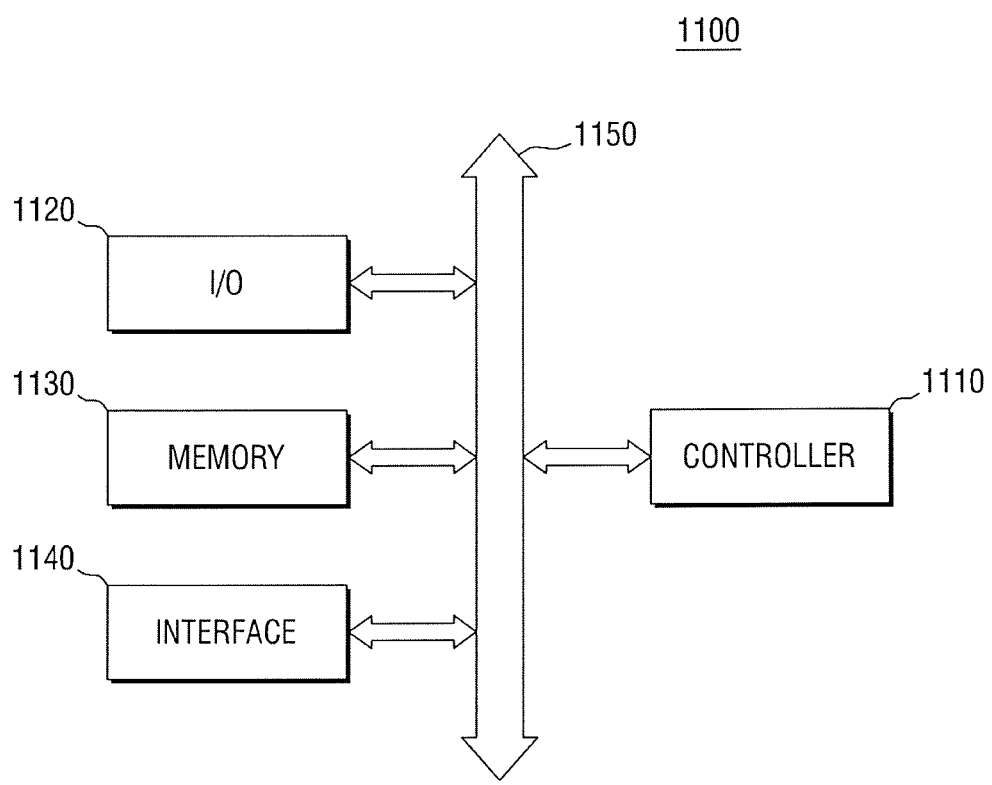
FIG. 15 is a block diagram of an electronic system including a semiconductor device according to an exemplary embodiment of the present inventive concept.

FIG. 15 is a block diagram of an electronic system including a semiconductor device according to an exemplary embodiment of the present inventive concept.

Referring to FIG. 15, an electronic system 1100 may include, for example, a controller 1110, an input/output device 1120, a memory device 1130, an interface 1140, and a bus 1150. The controller 1110, the input/output device 1120, the memory device 1130, and the interface 1140 may communicate with each other through the bus 1150.

The controller 1110 may include, for example, a microprocessor, a digital signal processor, a microcontroller, or a similar device that can control an executive program. The input/output device 1120 may include, for example, a keypad, a keyboard, or a display. The memory device 1130 may store code or data for executing the controller 1110, and save data executed by the controller 1110. The memory device 1130 may include, for example, a semiconductor device according to an exemplary embodiment of the present inventive.

The system 1100 may be applied to a product such as, for example, a PDA (personal digital assistant), a portable computer, a web tablet, a wireless phone, a mobile phone, a digital music player, a memory card, etc.

Figure 16:
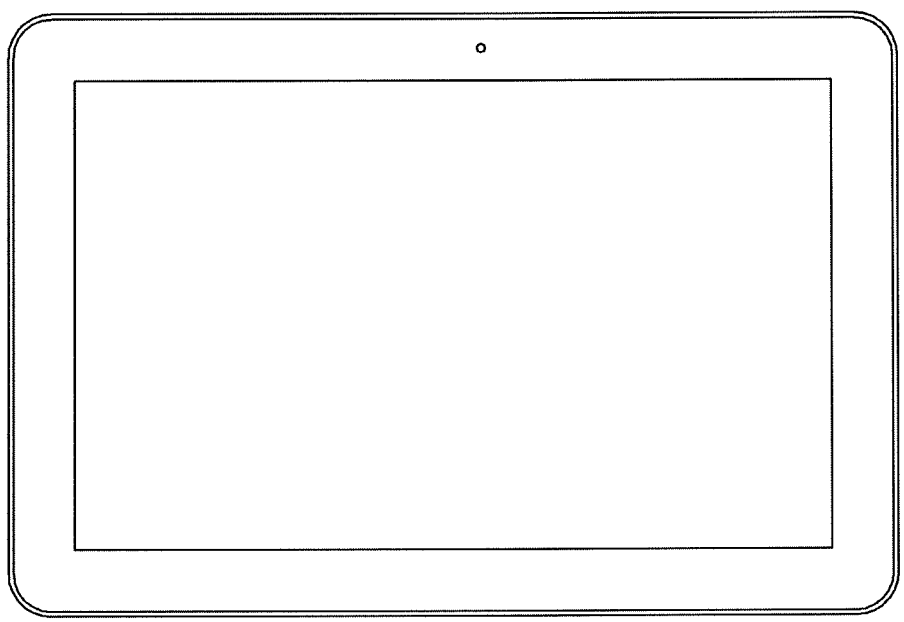
FIGS. 16 through 18 are examples of electronic products including semiconductor devices according to exemplary embodiments of the present inventive concept.
Figure 17:
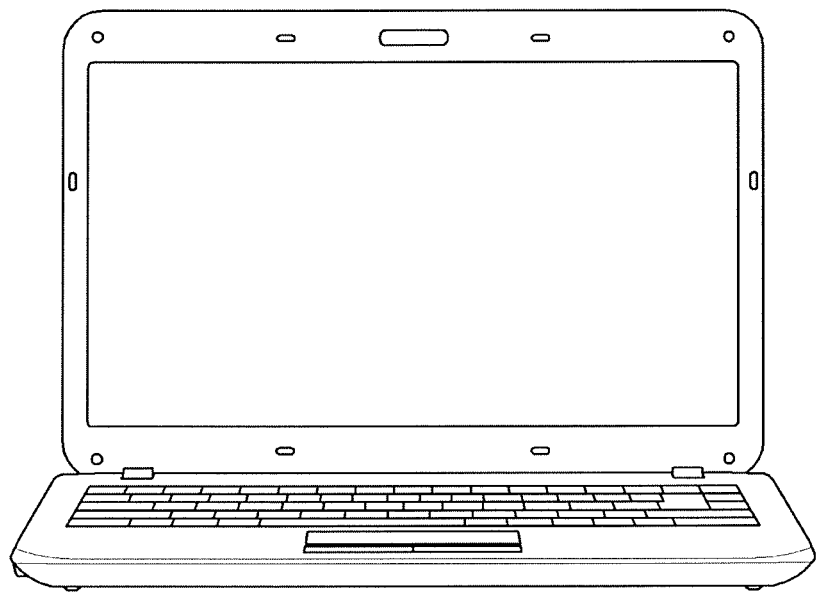
Figure 18:
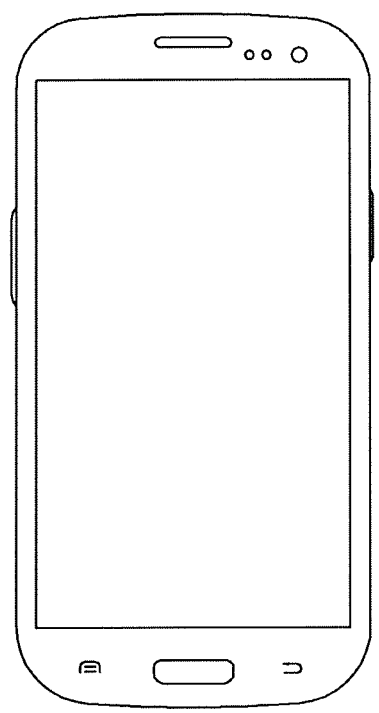

FIGS. 16 through 18 are examples of electronic products including semiconductor devices according to exemplary embodiments of the present invention. FIG. 16 shows a tablet computer 1200, FIG. 17 shows a notebook computer 1300, and FIG. 18 shows a smartphone 1400. A semiconductor device according to at least one exemplary embodiment of the present inventive concept described herein may be utilized in the tablet computer 1200, the notebook computer 1300, or the smartphone 1400.

FIGS. 19 through 24 are perspective views illustrating a method of manufacturing a semiconductor device according to an exemplary embodiment of the present inventive concept.

Figure 19:
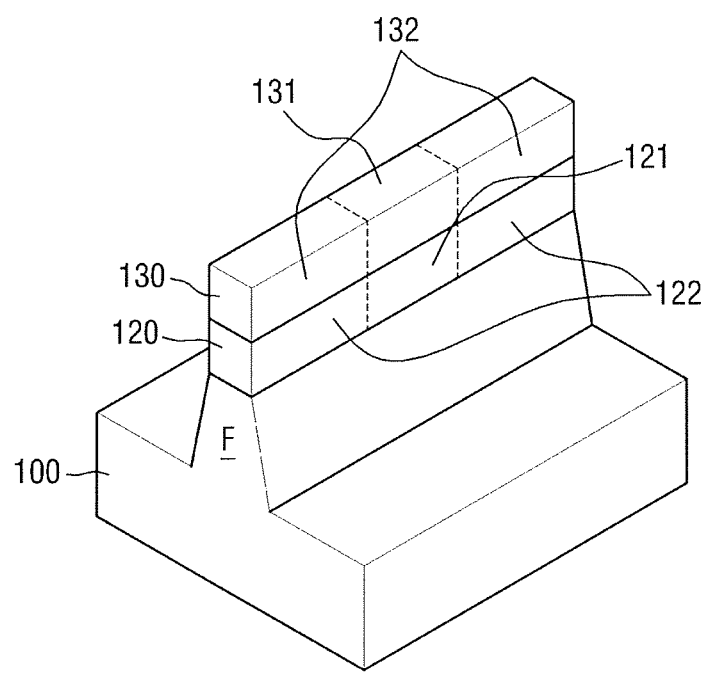
FIGS. 19 through 24 are perspective views illustrating a method of manufacturing a semiconductor device according to an exemplary embodiment of the present inventive concept.

Referring to FIG. 19, a first epitaxial layer may be formed on a substrate 100 using a first epitaxial growth process. The first epitaxial layer may include, for example, silicon germanium (SiGe). A second epitaxial layer may be formed on the first epitaxial layer using a second epitaxial growth process. The second epitaxial layer may include, for example, silicon (Si).

The second epitaxial layer may be etched to form an active layer pattern 130, and the first epitaxial layer may be etched to form a sacrificial layer pattern 120. The substrate 100 may be etched in a certain depth to form a fin structure F.

In an exemplary embodiment, the second epitaxial layer, the first epitaxial layer, and the substrate 100 may be sequentially etched using a dry etch process. A device isolation structure 110 (shown in FIGS. 1 and 4) may be formed on the substrate 100 to cover the fin structure F.

Figure 20A:
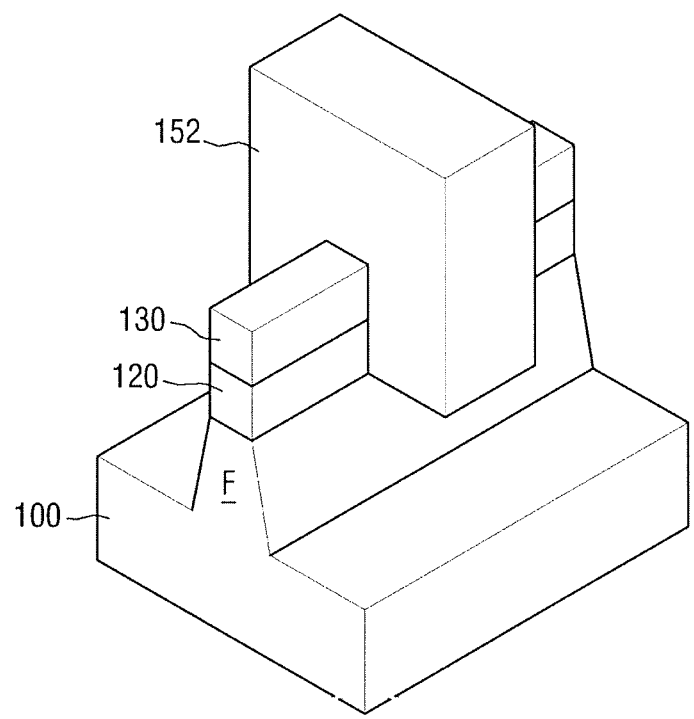

The active layer pattern 130 may have a first region 131 and a second region 132. The first region 131 of the active layer pattern 130 may be formed under a dummy gate layer 152, as shown in FIG. 20A. The first region 131 of the active layer pattern 130 may be a channel layer of a gate-all-around transistor. The second region 132 of the active layer pattern 130 may be formed under the source/drain structure 140, as shown in FIG. 20C.

The sacrificial layer pattern 120 may also include a first region 121 and a second region 122. The first region 121 of the sacrificial layer pattern 120 may be formed under the first region 131 of the active layer pattern 130. The second region 122 of the sacrificial layer pattern 120 may be formed under the second region 132 of the active layer pattern 130.

According to an exemplary embodiment of the present inventive concept, the substrate 100 may be formed on an SOI substrate. In this case, the substrate 100 may be formed using an epitaxial growth process, and may include silicon (Si). The first region 121 of the sacrificial layer pattern 120 may be removed to form a gate-all-around transistor, as shown in FIG. 6.

Referring to FIG. 20A, a dummy gate pattern 152 crossing over the active layer pattern 130 may be formed on the first region 131 of the active layer pattern 130. The dummy gate pattern 152 may cover the first region 121 of the sacrificial layer pattern 120. The dummy gate pattern 152 may include, for example, a polysilicon layer.

Figure 20B:
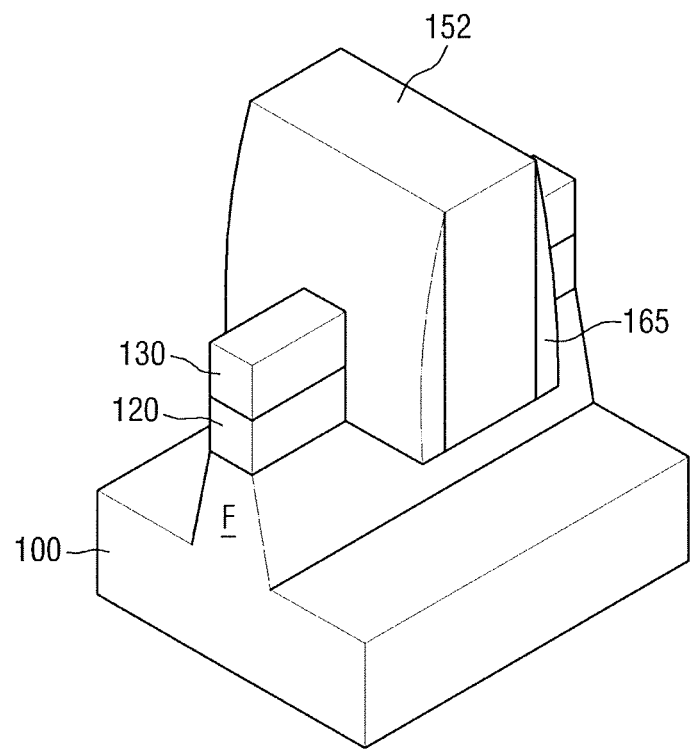
Figure 20C:
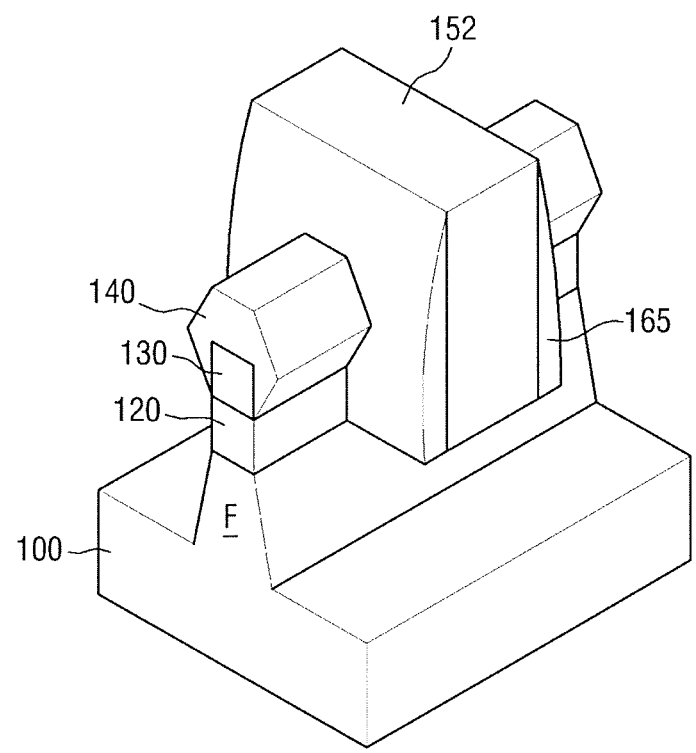

Referring to FIG. 20B, a spacer 165 may be formed on both sidewalls of the dummy gate pattern 152. The spacer 165 may include, for example, at least one of silicon nitride (SiN) or silicon oxynitride (SiON).

Referring to FIG. 20C, a source/drain structure 140 may be formed at both sides of the dummy gate pattern 152. The source/drain structure 140 may be formed using an epitaxial growth process. The lowermost surface of the source/drain structure 140 may have a level higher than or about equal to the uppermost surface of the sacrificial layer pattern 120. The source/drain structure 140 may be isolated or separated from the dummy gate pattern 152 by the spacer 165.

An impurity may be injected into the source/drain structure 140 using, for example, an ion implantation process. The impurity may also be injected into the second region 132 of the active layer pattern 130.

In an exemplary embodiment, the source/drain structure 140 may be formed on the active layer pattern 130 after partially recessing the second region 132 of the active layer pattern 130.

Figure 21:
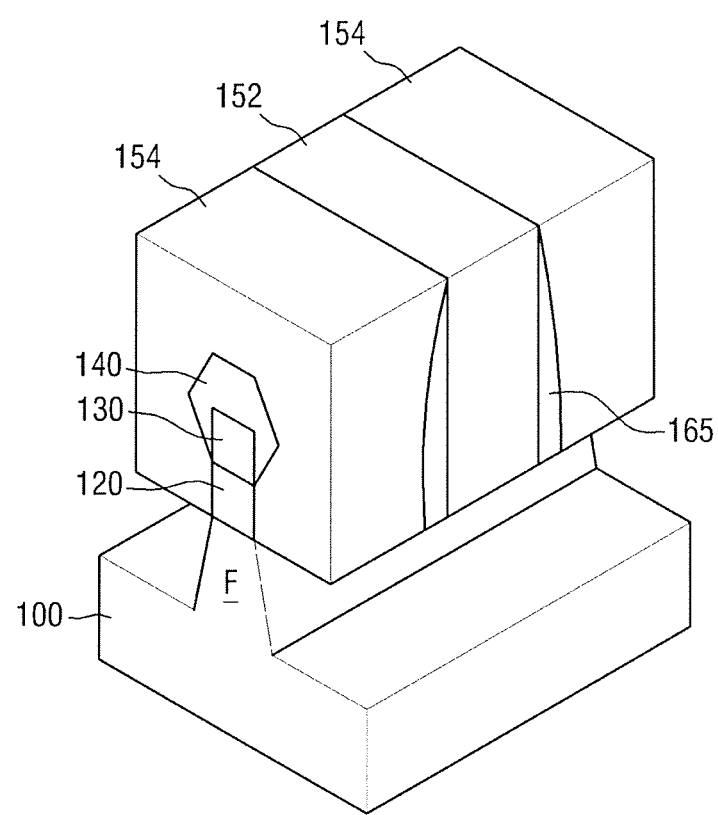

Referring to FIG. 21, an interlayer dielectric layer 154 may be formed on the source/drain structure 140. The interlayer dielectric layer 154 may be planarized to expose the upper surface of the dummy gate pattern 152 after forming the interlayer dielectric layer 154 on the dummy gate pattern 152 and the source/drain structure 140. The interlayer dielectric layer 154 may include, for example, a silicon oxide layer or a silicon oxynitride layer.

Figure 22:
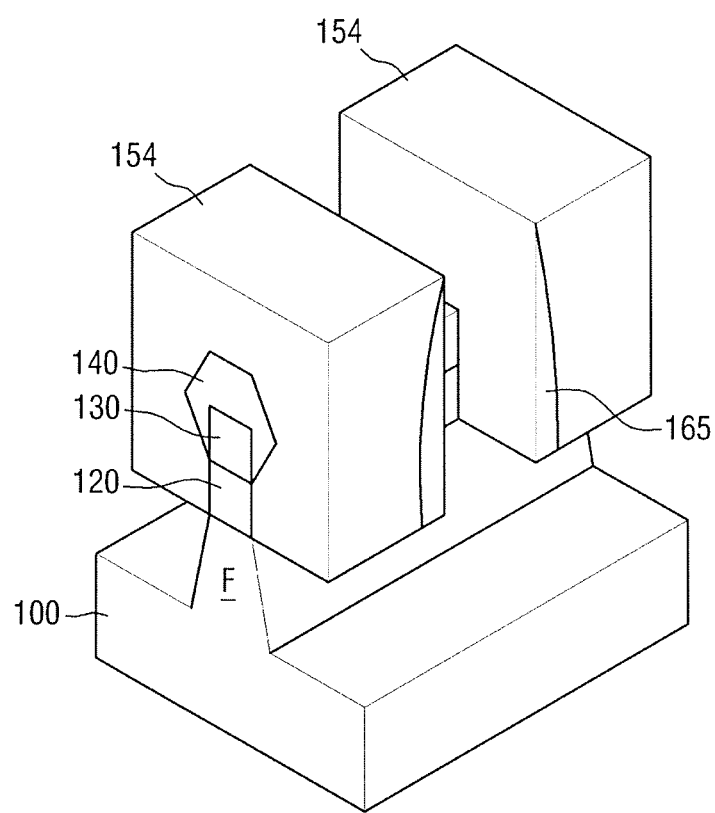

Referring to FIG. 22, the dummy gate pattern 152 may be removed to expose the first region 131 of the active layer pattern 130, as well as the first region 121 of the sacrificial layer pattern 120. Referring to the sacrificial layer pattern 120, only the sidewalls of the first region 121 may be exposed after removing the dummy gate pattern 152. The dummy gate pattern 152 may be removed using, for example, at least one of a dry etching process and a wet etching process.

Figure 23:
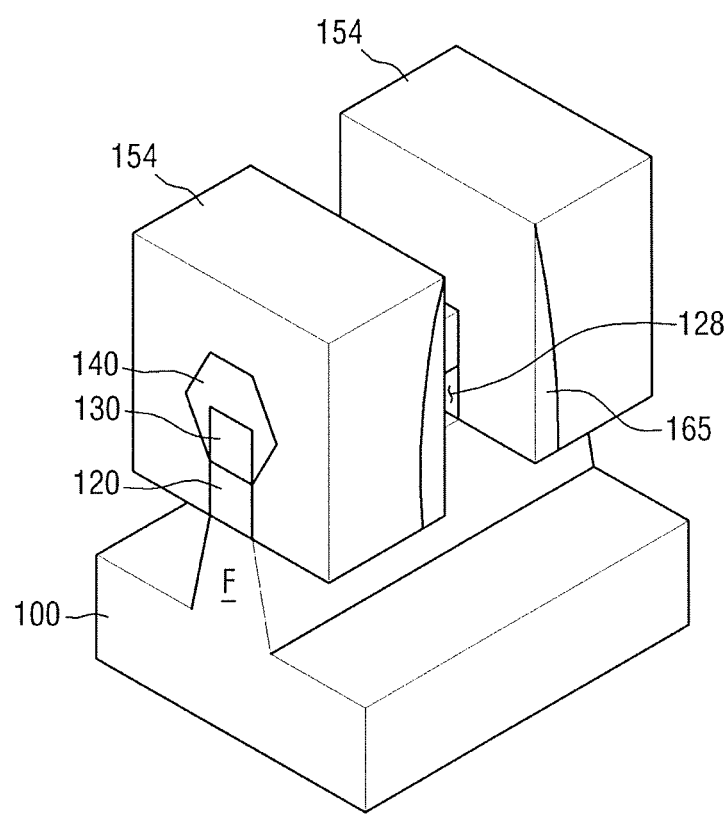

Referring to FIG. 23, the exposed first region 121 of the sacrificial layer pattern 120 may be removed using a selective etching process. Therefore, the bottom surface of the first region 131 of the active layer pattern 130 may be exposed, and a through-hole 128 may be formed under the first region 131. The selective etching process may be performed using a wet etchant including, for example, hydrogen chloride (e.g., hydrochloric acid).

Figure 24:
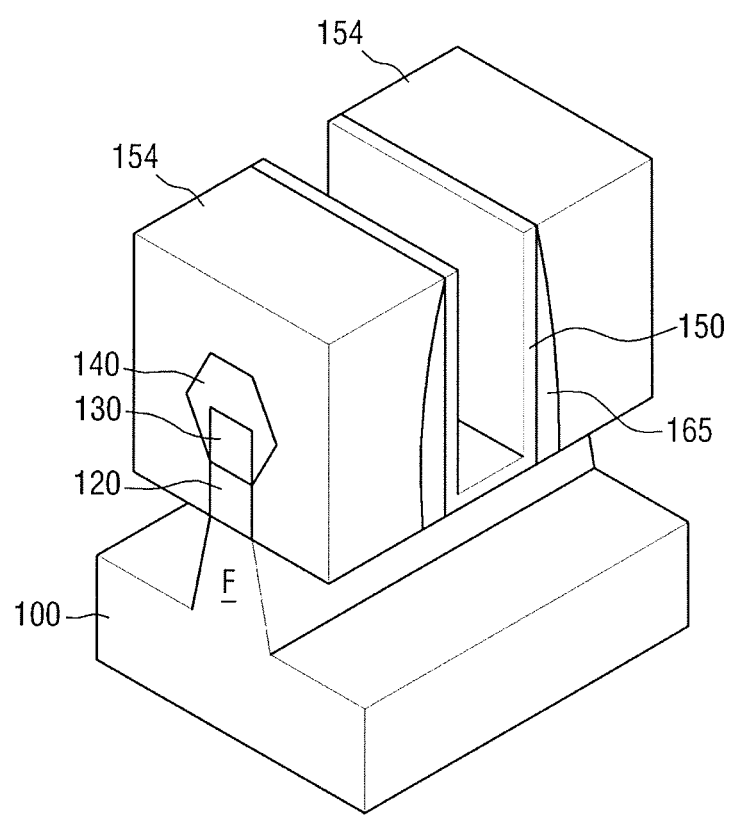

Referring to FIG. 24, a gate dielectric layer 150 may be formed on the exposed surface of the active layer pattern 130. The gate dielectric layer 150 may surround the first region 131 of the active layer pattern 130. In an exemplary embodiment, the gate dielectric layer 150 completely surrounds the first region 131 of the active layer pattern 130. The gate dielectric layer 150 may be simultaneously formed on the upper surface, the side surface, and the bottom surface of the first region 131 of the active layer pattern 130. The gate dielectric layer 150 may be formed and extended upwardly along an inner sidewall of the spacer 165.

Referring again to FIGS. 1 through 3, a gate electrode layer 160 may be formed on the gate dielectric layer 150. The gate electrode layer 160 may extend through the through-hole 128 and surround the first region 131 of the active layer pattern 130. Therefore, the gate electrode layer 160 may extend through a portion of the sacrificial layer pattern 120.

In an exemplary embodiment in which the sacrificial layer pattern 120 includes an insulating layer such as, for example, a silicon oxide layer, the gate-all-around transistor may be formed in a similar manner to the second gate-all-around transistor TR2 shown in FIGS. 4 through 6.

In an exemplary embodiment in which the first region 121 of the sacrificial layer pattern 120 is substituted by an insulating layer 170, as shown in FIG. 9, the gate-all-around transistor may be formed in a similar manner to the third gate-all-around transistor TR3 shown in FIGS. 8 and 9.

While the present inventive concept has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A semiconductor device, comprising:
a fin structure disposed on a substrate;
a sacrificial layer pattern disposed on the fin structure;
an active layer pattern disposed on the sacrificial layer pattern;
a gate dielectric layer and a gate electrode layer extending through the sacrificial layer pattern and surrounding a portion of the active layer pattern;
a spacer disposed on a sidewall of the gate electrode layer; and
a source/drain structure disposed on the active layer pattern,
wherein the source/drain structure is separated from the gate electrode layer by the spacer,
wherein the sacrificial layer pattern is disposed under the source/drain structure and is not disposed under the gate electrode layer.

2. The semiconductor device of claim 1, wherein the source/drain structure covers an upper surface of the active layer pattern and a sidewall of the active layer pattern.

3. The semiconductor device of claim 1, wherein the sacrificial layer pattern comprises a semiconductor material.

4. The semiconductor device of claim 3, wherein the semiconductor material comprises silicon germanium (SiGe).

5. A semiconductor device, comprising:
a fin structure disposed on a substrate;
a sacrificial layer pattern disposed on the fin structure;
an active layer pattern disposed on the sacrificial layer pattern; and
a gate dielectric layer and a gate electrode layer extending through the sacrificial layer pattern and surrounding a portion of the active layer pattern,
wherein the sacrificial layer pattern comprises an insulating material.

6. The semiconductor device of claim 5, wherein the insulating material comprises silicon oxide.

7. The semiconductor device of claim 5, wherein the gate electrode layer comprises a metal.

8. The semiconductor device of claim 5, wherein the substrate comprises a silicon-on-insulator (SOI) substrate.

9. A semiconductor device, comprising:
a fin structure disposed on a substrate;
a sacrificial layer pattern disposed on the fin structure;
an active layer pattern disposed on the sacrificial layer pattern; and
a gate dielectric layer and a gate electrode layer extending through the sacrificial layer pattern and surrounding a portion of the active layer pattern;
wherein the substrate comprises a first region and a second region,
wherein the fin structure comprises a first fin structure disposed in the first region and a second fin structure disposed in the second region,
wherein the sacrificial layer pattern comprises a first sacrificial layer pattern disposed on the first fin structure and a second sacrificial layer pattern disposed on the second fin structure,
wherein the active layer pattern comprises a first active layer pattern disposed on the first sacrificial layer pattern and a second active layer pattern disposed on the second sacrificial layer pattern,
wherein the gate dielectric layer comprises a first gate dielectric layer and a second gate dielectric layer,
wherein the gate electrode layer comprises a first gate electrode layer and a second gate electrode layer,
wherein the first gate dielectric layer and the first gate electrode layer extend through the first sacrificial layer pattern and surround a portion of the first active layer pattern,
wherein the second gate dielectric layer and the second gate electrode layer extend through the second sacrificial layer pattern and surround a portion of the second active layer pattern.

10. The semiconductor device of claim 9, wherein the first sacrificial layer pattern comprises a semiconductor material and the second sacrificial layer pattern comprises an insulating material.

11. The semiconductor device of claim 10, wherein the semiconductor material comprises silicon germanium (SiGe) and the insulating material comprises silicon oxide.

12. The semiconductor device of claim 9, further comprising:
a first gate-all-around transistor comprising the first fin structure, the first active layer pattern, the first gate dielectric layer, and the first gate electrode layer; and
a second gate-all-around transistor comprising the second fin structure, the second active layer pattern, the second gate dielectric layer, and the second gate electrode layer,
wherein the first gate-all-around transistor comprises a PMOS transistor and the second gate-all-around transistor comprises an NMOS transistor.

13. The semiconductor device of claim 9, wherein the first sacrificial layer pattern has a first germanium concentration and the second sacrificial layer pattern has a second germanium concentration, and the first germanium concentration is less than the second germanium concentration.

14. A semiconductor device, comprising:
a substrate comprising a first region and a second region;
a first gate-all-around transistor disposed in the first region, wherein the first gate-all-around transistor comprises a first fin structure, a first sacrificial layer pattern disposed on the first fin structure, a first active layer pattern disposed on the first sacrificial layer pattern, and a first gate electrode layer extending through the first sacrificial layer pattern and surrounding a portion of the first active layer pattern; and a second gate-all-around transistor disposed in the second region, wherein the second gate-all-around transistor comprises a second fin structure, a second sacrificial layer pattern disposed on the second fin structure, a second active layer pattern disposed on the second sacrificial layer pattern, and a second gate electrode layer extending through the second sacrificial layer pattern and surrounding a first portion of the second active layer pattern.

15. The semiconductor device of claim 14, further comprising:

an insulating layer disposed under a second portion of the second active layer pattern, wherein the second portion of the second active layer pattern is not overlapped by the second gate electrode layer.

16. The semiconductor device of claim 15, wherein the insulating layer comprises a silicon oxide layer.

17. The semiconductor device of claim 14, wherein the first and second sacrificial layer patterns comprise a semiconductor material.

18. The semiconductor device of claim 17, wherein the semiconductor material comprises silicon germanium (SiGe).

19. The semiconductor device of claim 14, wherein the first region corresponds to a logic region and the second region corresponds to an SRAM region.

20. The semiconductor device of claim 14, wherein the first gate electrode layer completely surrounds the portion of the first active layer pattern, and the second gate electrode layer partially surrounds the first portion of the second active layer pattern.

* * * * *